United States Patent [19]
Hurwitt et al.

[11] Patent Number: 5,490,914
[45] Date of Patent: Feb. 13, 1996

[54] HIGH UTILIZATION SPUTTERING TARGET FOR CATHODE ASSEMBLY

[75] Inventors: Steven Hurwitt, Park Ridge, N.J.; Corey Weiss, Monsey, N.Y.

[73] Assignees: Sony Corporation, Tokyo, Japan; Materials Research Corporation, Orangeburg, N.Y.

[21] Appl. No.: 388,205

[22] Filed: Feb. 14, 1995

[51] Int. Cl.$^6$ .................................................. C23C 14/34
[52] U.S. Cl. ................. 204/298.12; 204/192.12; 204/298.19
[58] Field of Search .................. 204/298.12, 298.13, 204/298.19, 192.12; 72/362, 377; 29/505, 506, 509

[56] References Cited

U.S. PATENT DOCUMENTS

| | | | |
|---|---|---|---|
| 3,741,886 | 6/1973 | Urbanek et al. | 204/298.12 |
| 4,198,283 | 4/1980 | Class et al. | 204/298 |
| 4,428,816 | 1/1984 | Class et al. | 204/298 |
| 4,457,825 | 7/1984 | Lamont, Jr. | 204/298 |
| 4,472,259 | 9/1984 | Class et al. | 204/298 |
| 4,517,070 | 5/1985 | Kisner | 204/298.19 X |
| 4,855,033 | 8/1989 | Hurwitt | 204/298 |
| 5,069,772 | 12/1991 | Fritsche et al. | 204/298.19 X |
| 5,130,005 | 7/1992 | Hurwitt et al. | 204/192.12 |
| 5,284,561 | 2/1994 | Shinneman et al. | 204/192.13 |
| 5,336,386 | 8/1994 | Marx et al. | 204/298.12 |

Primary Examiner—Nam Nguyen
Attorney, Agent, or Firm—Wood, Herron & Evans

[57] ABSTRACT

A sputtering target comprises a disc machined from a first piece of target grade material, having a front sputtering face and a rear face opposite. The sputtering face and target material erode during use to define a final sputtered face contour and a residual target thickness t measured from the rear face. A hub is machined from a second piece of material and is secured to the rear face of the disc. The securement device utilizes a depth of target material measured from the rear face which minimizes the thickness t in a region adjacent the hub so as to maximize the amount of the target grade material sputterable before in the region before encountering the securement device. In another form, the disc and hub are forged from a single starting slug of target grade material. The slug has an initial height to diameter ratio such that the flow lines developed in displaced target material during forging which turn upward from the disc into the hub are located at a depth of the target material measured from the rear face which also minimizes the thickness t so as to maximize the amount of the target grade material sputterable.

28 Claims, 1 Drawing Sheet

HIGH UTILIZATION SPUTTERING TARGET FOR CATHODE ASSEMBLY

FIELD OF THE INVENTION

This invention relates generally to cathode sputtering, and more particularly to a sputtering target for use with a cathode sputtering assembly.

BACKGROUND OF THE INVENTION

Cathode sputtering refers to a process which involves the coating of a wafer mounted within a processing chamber. An applied electric field negatively biases a target of the material to be sputtered with respect to the processing chamber and wafer. A backplate may support the target. Upon introduction of an inert gas into the chamber at low pressure, the applied electric field ionizes the gas. As a result, positive ions from the gas bombard the target to cause sputtering of the target material onto the wafer. A magnet or electromagnet may be located behind the target to provide a magnetic field which confines the ionized "plasma" adjacent to the target. The magnetic field increases the efficiency of the sputtering process.

Some typical metals used in sputtering include aluminum alloys, gold, silver, copper, titanium, platinum, and refractory metals. Due primarily to the high purity required for sputtering, the cost of these sputtering materials is generally quite expensive, sometimes exceeding thousands of dollars per pound of material. For this reason, maximum target material utilization is a major consideration in the design of sputtering equipment. Another important consideration relates to the effective coverage of features on the surface of the wafer, either by planarizing an uneven surface or by adding additional conformal layers. Some sputtering equipment employs a variation of the magnetic field, or multiple erosion zones, or both, to coat wafer features in the desired manner.

In addition to maximum target utilization and effective coverage of a wafer surface, other practical considerations such as target mounting and costs of manufacture also play an important role in the design of sputtering equipment. While some target configurations may provide excellent performance, these advantages may be offset by the difficulty or costs associated with properly mounting the target to a backplate or the cathode assembly. For the most part, the machining of targets is difficult, expensive and time consuming.

Thus, in depositing thin films by sputtering, the costs and operating lifetime of the sputtering target are significant factors in the cost of the coated product. This is particularly true in the semiconductor industry where even targets of common materials are so highly purified and characterized as to have high intrinsic material value.

Additional factors which contribute to the cost of use include complex machining which is only utilized over the short life of a target; deeply contoured target shapes which require removal of large amounts of expensive material as machining scrap; and the utilization of the target, or the quantity of final products which can be coated before depletion of the target.

A cost effective target, therefore, is simple to machine or fabricate with minimal generation of scrap, and yields a large quantity of product over the lifetime of the target.

A typical sputtering target for a cathode assembly includes a disk shaped portion having a front sputtering face and a rear face opposite the sputtering face, and a hub which projects from the rear face of the disk and which is adapted to be secured to the cathode assembly. The hub is either integral with the disk, as when the hub and disk are machined or forged or pressed (as used herein, the term "forged" encompasses "forged" and "pressed") from a single piece of target grade material, or the hub is fabricated as a separate piece and is secured to the rear face of the disk portion by fasteners, for example bolts or the like. It will be appreciated that machining a disk with the integral hub out of a single flat piece of target grade material creates a large amount of machining scrap, and in addition requires a great amount of costly machining. If the hub is fabricated from a separate piece of material and is attached to the rear face of the disk portion of the target with fasteners, the fasteners, which penetrate into the disk from the rear face, limit the amount of the disk which is usable for the sputtering process in the vicinity of the interconnection of the hub to the disk. That is to say, as the sputtering face and target material erode during use to define a final sputtered face contour and a residual target thickness t measured from the rear face in the hub/disk interconnection region, the target cannot be sputtered to the extent that the fastening elements, for example, bolts, would begin to appear through the final sputtered face contour; i.e., the residual target thickness t measured from the rear face is limited by, and must be greater than, the depth the fastener elements protrude into the disk from the rear face.

However, the length of the fastener elements which extend into the disk from the rear face thereof and hence the depth of the tapped holes in the disk which receive those fastener elements cannot be shortened to the extent that the structural integrity of the hub/disk interconnection during sputtering is jeopardized for the sake of minimizing the residual target thickness t in order to maximize the amount of sputterable target grade material. For example, current hub/disk assemblies which utilize bolts as the fastening means of hub to disk generally require tapped holes for receiving the bolts at least 0.375 inch deep when the disk material is soft titanium or aluminum to ensure the structural integrity of the hub/disk joint during sputtering. Thus, current hub/disk assemblies fail to utilize, or otherwise waste, 0.375 inch of target grade material in the region of the hub/disk interconnection.

Should the target be forged from a starting slug of target grade material in order to form an integral hub/disk target assembly, still different problems are posed. During forging, flow lines are developed in the displaced target material. These flow lines can change the crystal orientation and hence the sputtering properties of the target near the center of the target where the hub is formed. When progressing from the front face of the target to the back face, flow lines which are generally parallel the back face are first encountered, but as sputtering continues, flow lines are encountered which turn upwardly from the disk portion of the target into the hub. The crystal structure of the target material in this region of upturned flow lines is different than that in the region of parallel flow lines and is generally less desirable as the sputtering properties of the material there are inferior to that of the material in the area of parallel flow lines. In current forged targets the residual target thickness t measured from the rear face of the target disk which includes the upturned flow lines and undesirable sputtering properties is at least 0.375 inch for all target grade materials, and for some current forged targets the undesirable upturned flow lines extend all the way to the front face of the target. Thus, assuming that current forged targets are not sputtered into the undesirable upturned flow lines, those targets fail to utilize, or otherwise waste, 0.375 inch of target material for all types of target materials in the region of the hub/disk interconnection, and for some forged targets, the targets exhibit the undesirable upturned flow lines all the way out to the front face resulting in inferior sputtering qualities throughout the entire thickness of the target.

It is therefore an objective of the present invention to provide a sputtering target which reduces the labor and amount of scrap normally attendant the machining of a target having an integral hub from a single piece of material.

It is another objective of the present invention to provide a target which utilizes a minimum thickness of the target material to attach the hub to the target yet which does not sacrifice the structural integrity of the hub/disk joint in the process.

It is yet another objective of the present invention to provide a forged target having superior sputtering properties near the center of the target in the location of the hub.

It is still another objective of the present invention to provide a forged target having upturned flow lines which occur nearer the back face of the target than those of current forged targets to thereby increase the utilization of the target grade material.

SUMMARY OF THE INVENTION

The present invention attains the stated objectives by providing a sputtering target for a cathode assembly. The sputtering target comprises a disc having a front sputtering face and a rear face opposite the sputtering face. The sputtering face and target material erode during use to define a final sputtered face contour and a residual target thickness t measured from the rear face. The hub projects from the rear face of the disc and is adapted to be secured to the cathode assembly. The disc and hub are forged from a single starting slug of target grade material. The slug has an initial height to diameter ratio such that the flow lines developed in displaced target material during forging which turn upward from the disc into the hub are located at a depth of the target material measured from the rear face which minimizes the thickness t in a region adjacent the hub so as to maximize the amount of the target grade material sputterable in the region before encountering the flow lines which turn upward from the disc into the hub. The target thereby reduces the labor and amount of scrap normally attendant the machining of a target having an integral hub from a single flat piece of material, increases the utilization of the target grade material and provides a target having superior sputtering properties near the center of the target.

In a preferred form, the starting slug has an initial height to diameter ratio of at least about 1.5 to 1. The forged target permits a thickness t less than 0.375 inch, and as little as 0.188 inch.

In another form of the present invention, the sputtering target comprises a disc machined from a first piece of target grade material. A hub is machined from a second piece of material and is for securement to the rear face of the disc and is adapted to be secured to the cathode assembly. Securement means are provided for securing the hub to the rear face. The securement means utilize a depth of target material measured from the rear face which minimizes the thickness t in a region adjacent the hub so as to maximize the amount of the target grade material sputterable in the region before encountering the securement means. The target thereby reduces the labor and amount of scrap normally attendant the machining of a target having an integral hub from a single flat piece of material, and increases the utilization of the target grade material.

The securement means is formed by mechanically deforming a portion of the target on the rear face to retain the hub against the rear face. The securement means may further comprise projections extending upwardly from the rear face, the hub including a flange for abutting engagement with the rear face and including apertures therein which accept the projections therethrough, with the projections being mechanically deformed after insertion through the apertures to retain the hub against the rear face. Alternatively, the securement means may further comprise a lip forming a part of the rear face, the hub including a flange for abutting engagement with the rear face, with the lip being mechanically deformed over the flange to retain the hub against the rear face.

Either embodiment of the securement means permits a thickness t less than 0.375 inch, and as little as 0.188 inch.

The present invention also provides methods for fabricating the aforementioned sputtering targets.

One advantage of the present invention is that a sputtering target is provided which reduces the labor and amount of scrap normally attendant the machining of a target having an integral hub from a single flat piece of material.

Another advantage of the present invention is that a sputtering target is provided which increases the utilization of the target grade material yet which does not sacrifice the structural integrity of the hub/disk joint in the process.

Yet another advantage of the present invention is that a target is provided which has superior sputtering properties near the center of the target where the hub is joined to the target, which target and hub are forged from a single starting slug of target grade material.

Still another advantage of the present invention is that a forged target is provided which has upturned flow lines which occur nearer the back of the target than those of current forged targets thereby increasing utilization of the target grade material.

These and other objects and advantages of the present invention will become more readily apparent during the following detailed description taken in conjunction with the drawings herein, in which:

DETAILED DESCRIPTION OF THE INVENTION

Figure 1:
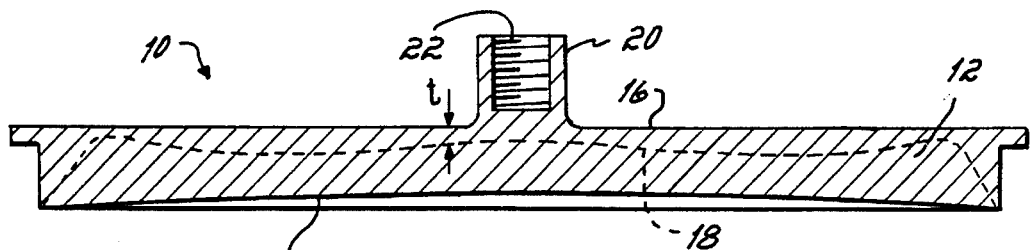
FIG. 1 is a cross sectional view along a diameter of a sputtering target incorporating the principles of the present invention.

Referring first to FIG. 1, there is illustrated a sputtering target 10 according to the principles of the present invention. The sputtering target 10 includes, generally, a disc 12 having a front sputtering face 14 and a rear face 16 opposite the sputtering face 14. The sputtering face 14 and target material erode during use to define a final sputtered face contour 18 and a residual target thickness t measured from the rear face 16, which varies radially with the target 10. A hub 20 projects from the rear face 16 of the disc 12 of the target 10 and is adapted to be secured to a cathode assembly by virtue of a tapped hole 22.

Figure 2:
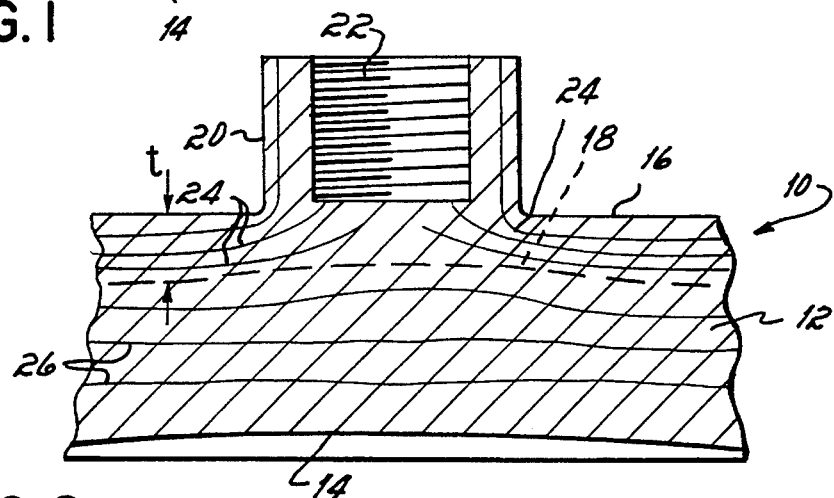
FIG. 2 is an enlarged view of the target and hub of FIG. 1.

With reference now to FIGS. 1 and 2, the disc 12 and hub 20 are illustrated as being forged from a single starting slug (not shown) of target grade material. Flow lines 24 are created by the forging process and turn upwardly from the disk 12 into the hub 20. Due to the disturbed crystal orientation of the target material in this region, the sputtering properties of the material in this region are less desirable and generally inferior to the material which exhibits flow lines 26 which are generally parallel to the rear face 16 of the target 10. Thus it is not desirable to sputter the target 10 beyond the point where the upturned flow lines 24 begin. It is desirable though when forging the target 10 to produce upturned flow lines 24 which reside as close to rear face 16 as possible. Thus final sputtered face contour 18 may be generated as close to rear face 16 as possible thus minimizing the thickness t in the region adjacent, or beneath, the hub 20 or otherwise in the area of the interconnection of the hub 20 and the disk 12 so as to maximize the-amount of target material sputterable in that region before encountering the upturned flow lines 24. It has been determined that the slug initial height to diameter ratio determines the point at which the flow lines 24 turn upwardly from the disc 12 to the hub 20 and thus the depth measured from the rear face 16 of the target 10 which produces a minimum thickness t in the region adjacent the hub 20 so as to maximize the amount of the target grade material sputterable in the region before encountering the upturned flow lines 24. In the preferred form of the present invention, the starting slug has an initial height to diameter ratio of at least about 1.5 to 1. Such an aspect ratio permits a thickness t less than 0.375 inch for all target grade materials, and as little as 0.188 inch. Generally sputtering cannot proceed any closer to rear face 16 than about 0.188 inch to insure the structural integrity of the hub/disk interconnection during sputtering.

Figure 3:
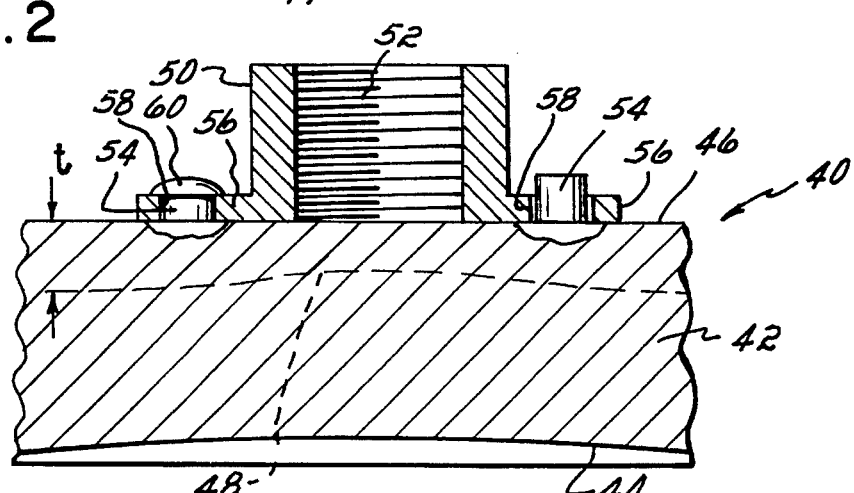
FIG. 3 is a view similar to FIG. 2 but of an alternative form of the present invention.

Referring now to FIG. 3, there is shown an alternative form of the present invention. In this form, a sputtering target 40 has a disc 42 machined from a first piece of target grade material. The disc 42 includes a front sputtering face 44 and a rear face 46 opposite the sputtering face 44. The sputtering face 44 and target material erode during use to define a final sputtered face contour 48 and a residual target thickness t measured from the rear face 46. A hub 50 is machined from a second piece of material for securement to the rear face 46 of disc 42 and is adapted to be secured to the cathode assembly by virtue of a tapped hole 52. Projections 54 extend upwardly from the rear face 46 of disc 42. Projections 54 are substantially shorter than the height of hub 50 and thus substantial machining and machining generated scrap are saved when compared to current targets with integral disk and hub machined out of a single flat piece of target grade material. Projections 54 are preferably machined from a raised boss formed as by forging or pressing the disk 42. The hub 50 includes a flange 56 for abutting engagement with the rear face 46 of the disc 42 and includes apertures 58 therein which accept the projections 54. The projections are subsequently mechanically deformed as by peening at 60 to retain the hub against the rear face 46. Projections or posts 54 are preferably about 0.25 inch in diameter and 0.25 inch high and are 6 to 8 in number. Flange 56 is preferably about 0.125 inch thick. This means of securing the hub 50 to the rear face 46 utilizes a depth of target material measured from the rear face which minimizes the thickness t in the region adjacent, or beneath, the hub 50 so as to maximize the amount of target grade material sputterable in the region before encountering the securement means. Generally sputtering cannot proceed any closer to rear face 16 than about 0.188 inch to insure the structural integrity of the hub/disk interconnection during sputtering. The target 40 thereby reduces the labor and amount of scrap normally attendant the machining of the target having an integral hub from a single piece of material, and increases the utilization of the target grade material.

Figure 4:
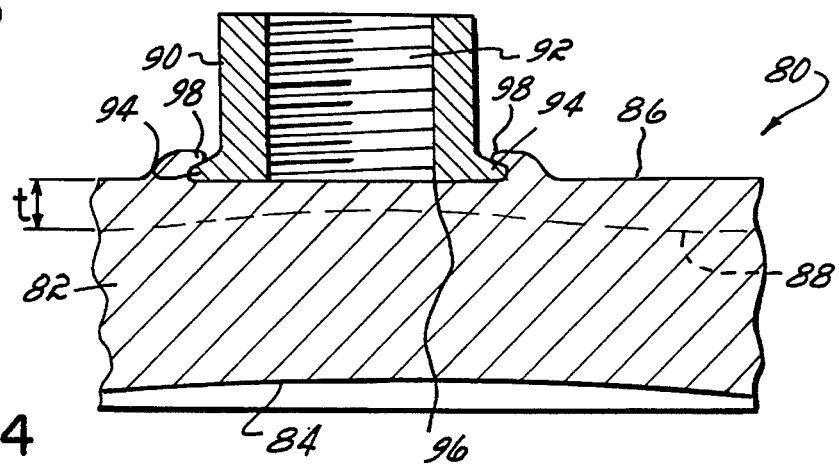
FIG. 4 is a view similar to FIGS. 2 and 3 but of yet another alternative form of the present invention.

Referring now to FIG. 4, there is illustrated yet another form of the present invention. In this embodiment, a target 80 includes a disc 82 having a sputtering face 84 and a rear face 86. A final sputtered face contour 88 develops during sputtering. A hub 90 is attached to the rear face 86 of the disc 82, and is adapted to be secured to the cathode assembly by virtue of a tapped hole 92. The hub 90 includes a flange 94 for abutting engagement with the face 86. Rear face 86 further includes a circumferential lip 98 machined from a raised boss formed as by forging or pressing the disc 82 which, after the flange 94 of hub 90 is abutted against face 86, is mechanically deformed or rolled over the flange 94 to retain the hub 90 against the rear face 86 of the target 80. Lip 98 is preferably about 0.25 inch high, and flange 94 as well as lip 98 are preferably about 0.188 inch wide. As in the prior embodiment, this securement mechanism utilizes a depth of target material measured from the rear face 86 which minimizes the thickness t in the region adjacent the hub so as to maximize the amount of target grade material sputterable in the region before encountering the securement means. Generally sputtering cannot proceed any closer to rear face 16 than about 0.188 inch to insure the structural integrity of the hub/disk interconnection during sputtering.

For both embodiments of the securement means illustrated in FIGS. 3 and 4, thickness t is permitted to be less than 0.375 inch for aluminum and soft titanium target material and similar target materials, and as little as 0.188 inch. Both embodiments illustrated in FIGS. 3 and 4 provide a strong mechanical attachment of hub to disk and do not jeapardize the structural integrity of the hub/disk interconnection during sputtering which can occur when the bolts and tapped holes of current target assemblies are shortened.

Those skilled in the art will readily recognize numerous adaptations and modifications which can be made to the present invention which will result in an improved sputtering target for a cathode assembly and method of fabricating same, yet all of which will fall within the spirit and scope of the present invention as defined in the following claims. For example, other methods of mechanical or metallurgical attachment may be utilized to attach the hub portion to the disk portion of the target so long as t is minimized so as to maximize the amount of target grade material sputterable. Metallurgical attachment methods may include welding or brazing. Accordingly, the invention is to be limited only by the scope of the following claims and their equivalents.

What is claimed is:

1. A sputtering target for a cathode assembly comprising:

a disk having a front sputtering face and a rear face opposite said sputtering face, said sputtering face and target material eroding during use to define a final sputtered face contour and a residual target thickness t measured from said rear face;

a hub projecting from said rear face of said disk and being adapted to be secured to the cathode assembly;

said disk and hub being forged from a single starting slug of target grade material, said slug having an initial height to diameter ratio such that the flow lines developed in displaced target material during forging which turn upward from said disk into said hub are located at a depth of said target grade material measured from said rear face which minimizes the thickness t in a region adjacent said hub so as to maximize the amount of said target grade material sputterable in said region before encountering the flow lines which turn upward from said disk into said hub;

said target thereby reducing the labor and amount of scrap normally attendant the machining of a target having an integral hub from a single flat piece of material, increasing the utilization of said target grade material and providing a target having superior sputtering properties near the center of the target.

2. The sputtering target of claim 1 wherein said starting slug has an initial height to diameter ratio of at least about 1.5 to 1.

3. The sputtering target of claim 1 wherein t is less than 0.375 inch.

4. The sputtering target of claim 1 wherein t is about 0.188 inch.

5. The sputtering target of claim 1 wherein t is less than 0.375 inch and at least about 0.188 inch.

6. The sputtering target of claim 1 wherein t is in the range of about 0.188 inch to about 0.25 inch.

7. A method of fabricating a sputtering target for a cathode assembly comprising the steps of:

providing a starting slug of target grade material;

forging the slug to form a disk having a front sputtering face and a rear face opposite the sputtering face, the sputtering face and target material eroding during use to define a final sputtered face contour and a residual target thickness t measured from the rear face, and to form a hub projecting from the rear face of and integral with the disk and being adapted to be secured to the cathode assembly;

the slug having an initial height to diameter ratio such that the flow lines developed in displaced target material during forging which turn upward from the disk into the hub are located at a depth of the target material measured from the rear face which minimizes the thickness t in a region adjacent the hub so as to maximize the amount of target grade material sputterable in the region before encountering the flow lines which turn upward from the disk into the hub;

the method thereby reducing the labor and amount of scrap normally attendant the machining of a target having an integral hub from a single flat piece of material, increasing the utilization of the target grade material and providing a target having superior sputtering properties near the center of the target.

8. The method of claim 7 wherein the starting slug has an initial height to diameter ratio of at least about 1.5 to 1.

9. The method of claim 7 wherein t is less than 0.375 inch.

10. The method of claim 7 wherein t is about 0.188 inch.

11. The method of claim 7 wherein t is less than 0.375 inch and at least about 0.188 inch.

12. The method of claim 7 wherein t is in the range of about 0.188 inch to about 0.25 inch.

13. A sputtering target for a cathode assembly comprising:

a disk machined from a first piece of target grade material and having a front sputtering face and a rear face opposite said sputtering face, said sputtering face and target material eroding during use to define a final sputtered face contour and a residual target thickness t measured from said rear face;

a hub machined from a second piece of material for securement to said rear face and being adapted to be secured to the cathode assembly;

securement means for securing said hub to said rear face, said securement means utilizing a depth of said target material measured from said rear face which minimizes the thickness t in a region adjacent said hub so as to maximize the amount of said target grade material sputterable in said region before encountering said securement means;

said target thereby reducing the labor and amount of scrap normally attendant the machining of a target having an integral hub from a single piece of material, and increasing the utilization of said target grade material.

14. The sputtering target of claim 13 wherein:

said securement means is formed by mechanically deforming a portion of said target on said rear face to retain said hub against said rear face.

15. The sputtering target of claim 14 wherein said securement means further comprises:

projections extending upwardly from said rear face;

said hub including a flange for abutting engagement with said rear face and including apertures therein which accept said projections therethrough;

said projections being mechanically deformed after insertion through said apertures to retain said hub against said rear face.

16. The sputtering target of claim 14 wherein said securement means further comprises:

a lip forming a part of said rear face;

said hub including a flange for abutting engagement with said rear face;

said lip being mechanically deformed over said flange to retain said hub against said rear face.

17. The sputtering target of claim 13 where t is less than 0.375 inch.

18. The sputter target of claim 13 where t is about 0.188 inch.

19. The sputter target of claim 13 where t is less than 0.375 inch and at least about 0.188 inch.

20. The sputter target of claim 13 where t is in the range of about 0.188 inch to about 0.25 inch.

21. A method of fabricating a sputtering target for a cathode assembly comprising:

providing a first piece of target grade material;

machining a disk from the first piece of target grade material which has a front sputtering face and a rear face opposite the sputtering face, the sputtering face and target material eroding during use to define a final sputtered face contour and a residual target thickness t measured from the rear face;

providing a second piece of material;

machining a hub from the second piece of material for securement to the rear face of the disk which is adapted to be secured to be secured to the cathode assembly;

securing the hub to the rear face with a securement means which utilizes a depth of target material measured from the rear face which minimizes the thickness t in a region adjacent the hub so as to maximize the amount of the target grade material sputterable in the region before encountering the securement means;

the method thereby reducing the labor and amount of scrap normally attendant the machining of a target having an integral hub from a single piece of material, and increasing the utilization of the target grade material.

22. The method of claim 21 wherein:

the securement means is formed by mechanically deforming a portion of the target on the rear face to retain the hub against the rear face.

23. The method of claim 22 wherein the securement means further comprises:

projections extending upwardly from the rear face;

the hub including a flange for abutting engagement with the rear face and including apertures therein which accept the projections therethrough;

the projections being mechanically deformed after insertion through the apertures to retain the hub against the rear face.

24. The method of claim 22 wherein the securement means further comprises:

a lip forming a part of the rear face;

the hub including a flange for abutting engagement with the rear face;

the lip being mechanically deformed over the flange to retain the hub against the rear face.

25. The method of claim 21 where t is less than 0.375 inch.

26. The method of claim 21 where t is about 0.188 inch.

27. The method of claim 21 where t is less than 0.375 inch and at least about 0.188 inch.

28. The method of claim 21 where t is in the range of about 0.188 inch to about 0.25 inch.

* * * * *